United States Patent
Chen et al.

(10) Patent No.: US 6,808,012 B1
(45) Date of Patent: Oct. 26, 2004

(54) CPU RADIATOR HOLDING MECHANISM

(75) Inventors: Chih-peng Chen, Taipei (TW);
Hsin-cheng Lin, Lujou (TW)

(73) Assignee: Asia Vital Components Co., Ltd.,
Kaohsiung (TW)

( * ) Notice: Subject to any disclaimer, the term of this patent is extended or adjusted under 35 U.S.C. 154(b) by 0 days.

(21) Appl. No.: 10/411,233

(22) Filed: Apr. 11, 2003

(51) Int. Cl.[7] .............................................. H05K 7/20
(52) U.S. Cl. ..................... 165/80.3; 165/185; 257/722; 361/704
(58) Field of Search .............................. 165/80.3, 185; 361/704, 710; 257/719, 722; 174/16.3

(56) References Cited

U.S. PATENT DOCUMENTS

| | | | |
|---|---|---|---|
| 6,266,245 B1 * | 7/2001 | Wei | 361/704 |
| 6,286,586 B2 * | 9/2001 | Cook | 165/80.3 |
| 6,430,051 B1 * | 8/2002 | Yang et al. | 361/704 |
| 6,542,367 B2 * | 4/2003 | Shia et al. | 361/703 |
| 6,568,464 B1 * | 5/2003 | He et al. | 165/80.3 |

* cited by examiner

*Primary Examiner*—A J Flanigan
(74) *Attorney, Agent, or Firm*—Bacon & Thomas, PLLC

(57) ABSTRACT

A CPU radiator holding mechanism. The mechanism includes a pressure-bearing unit, a pair of holding-down clamps, and a seat for holding a radiator to a main board above a CPU. The radiator is formed from radiating fins and is provided at a top thereof with a receiving recess for receiving the pressure-bearing unit therein. The holding-down clamps are provided with hooks for engaging with receiving holes provided on the seat. The radiator is connected to the seat by pressing the holding-down clamps against the pressure-bearing unit and engaging the hooks of the holding-down clamps with the receiving holes of the seat, such that any pressure applied by the holding-down clamps onto the pressure-bearing unit does not cause any deformation of the radiating fins of the radiator.

7 Claims, 9 Drawing Sheets

CPU RADIATOR HOLDING MECHANISM

FIELD OF THE INVENTION

The present invention relates to a CPU radiator holding mechanism that mainly includes a pressure-bearing unit, a pair of holding-down clamps, and a seat for holding a radiator above a CPU on a main board, such that any pressure applied by the holding-down clamps onto the pressure-bearing unit when holding the radiator to the main board does not cause any deformation of the radiator.

BACKGROUND OF THE INVENTION

The currently available central processing unit (CPU) for computers has a surprisingly high operating speed to execute many highly useful programs and hardware functions. However, the extremely high-speed CPU also produces very high amount of heat during its operation to adversely affect the performance of the CPU or even result in damage or loss of data stored in the computer, if the produced heat is not properly radiated. A common practice for general users to solve the problem of large quantity of heat produced by the CPU is to mount a radiator or a cooling fan to the CPU to dissipate the heat. The radiator may also be added with heat-transfer tubes to dissipate the heat more quickly.

In the case of a radiator added with the heat-transfer tubes, a holding-down clamping means is usually needed to closely connect the radiator to the CPU. However, a pressure applied by such holding-down clamping means onto the radiator would frequently deform radiating fins forming the radiator, resulting in poor contact of the radiating fins with the heat-transfer tubes and even bent heat-transfer tubes to largely reduce an overall thermal conductivity of the radiator.

It is therefore tried by the inventor to develop an improved CPU radiator holding mechanism to eliminate drawbacks existed in the conventional holding-down clamping means.

SUMMARY OF THE INVENTION

A primary object of the present invention is to provide a CPU radiator holding mechanism that includes a pressure-bearing unit mounted on a top of the CPU radiator to bear a pressure applied by holding-down clamps and thereby protects the radiator against deformation due to such pressure.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
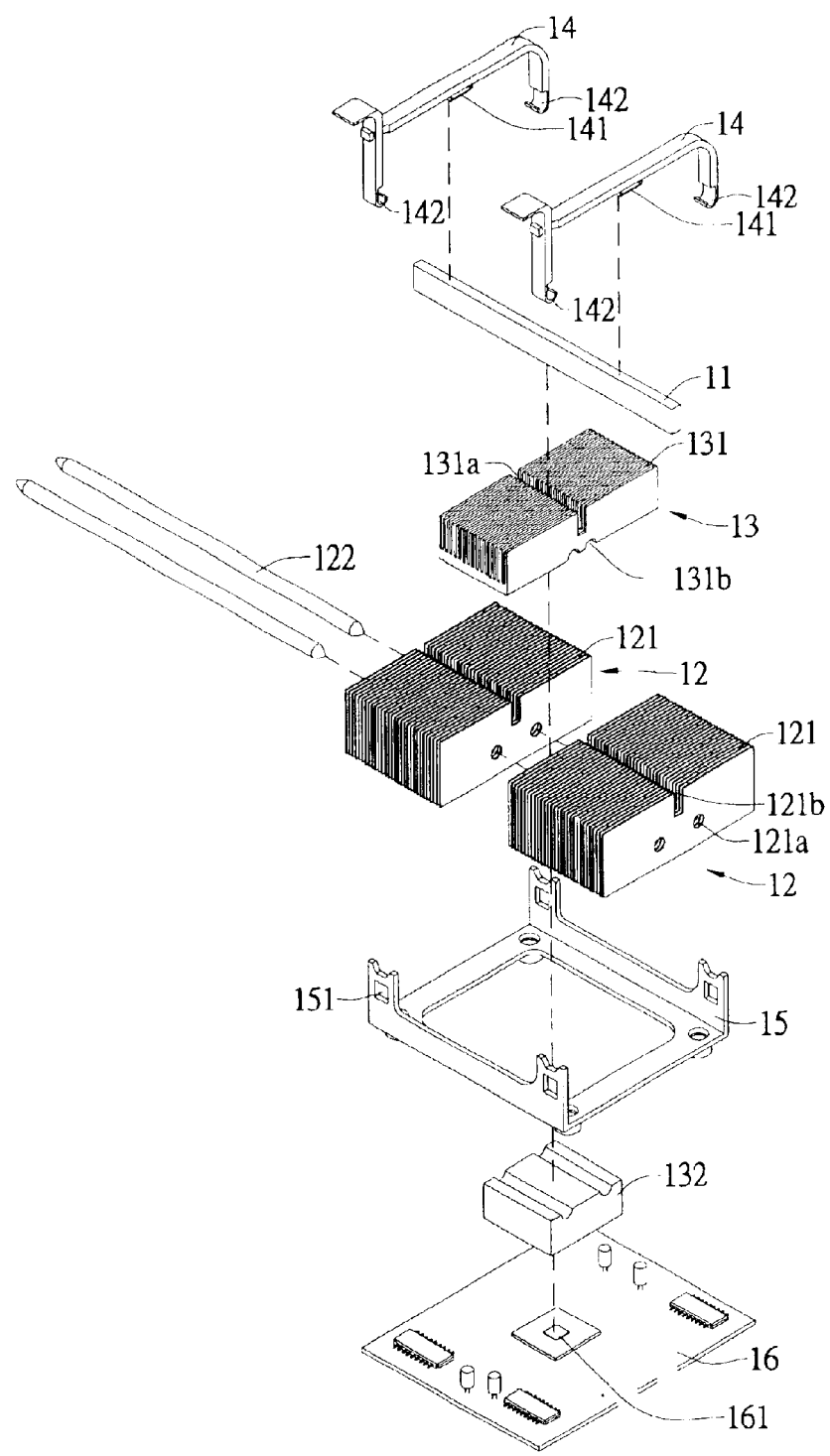
FIG. 1 is an exploded perspective view of a CPU radiator holding mechanism according to a first embodiment of the present invention.
Figure 2:
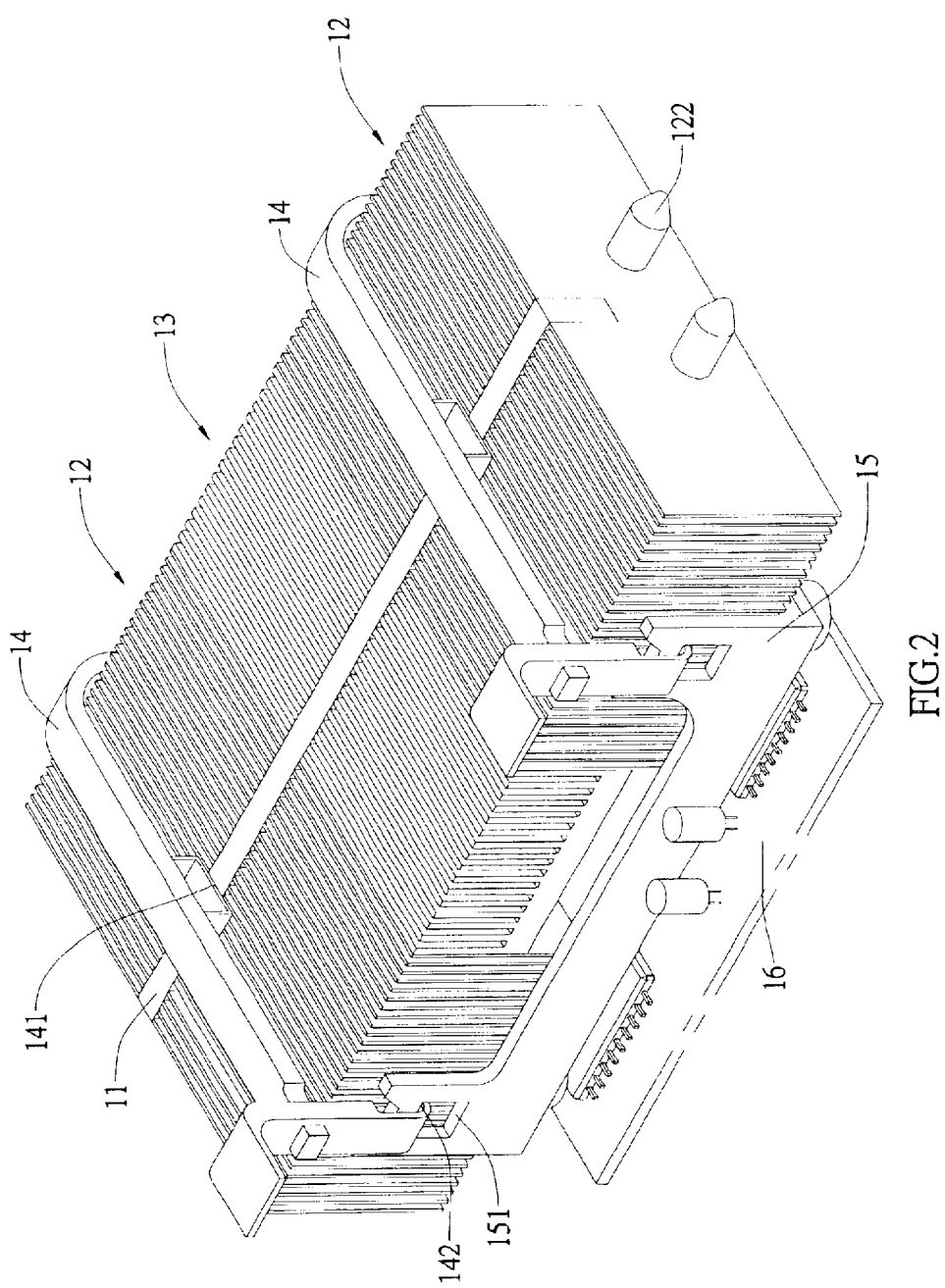
FIG. 2 is an assembled perspective view of FIG. 1.

Please refer to FIGS. 1 and 2 that are exploded and assembled perspective views, respectively, of a mechanism for holding a radiator to a central processing unit (CPU) according to a first embodiment of the present invention. For the purpose of simplicity, the present invention is referred to as the "CPU radiator holding mechanism" throughout the specification. As shown, the CPU radiator holding mechanism according to the first embodiment of the present invention mainly includes a pressure-bearing unit 11, a pair of holding-down clamps 14, and a seat 15 for holding a pair of first radiators 12 and a second radiator 13 onto a main board 16 on which a CPU 161 is mounted.

The pressure-bearing unit 11 includes a generally strip-shaped member made of a thermally conductive metal material, which may be selected from the group consisting of copper, aluminum, copper alloys, aluminum alloys, titanium alloys, and stainless steel, so that it also serves as an auxiliary radiating means of the first and second radiators 12, 13. Each of the first radiators 12 is formed from a plurality of vertically parallelly arranged radiating fins 121, and includes two horizontally spaced holes 121a longitudinally extended through the radiating fins 121, and a receiving recess 121b longitudinally extended through an upper side of the first radiator 12 to locate above and between the two holes 121a. The second radiator 13 is formed from a plurality of vertically parallelly arranged radiating fins 131, and includes an upper receiving recess 131a and two spaced lower receiving recesses 131b corresponding to the receiving recesses 121b and the two through holes 121a, respectively, on the first radiators 12. Each of the two holding-down clamps 14 includes a press head 141 downward protruded from a lower center thereof and two downward extended legs, each of which has a hook 142 formed at a free end thereof. The seat 15 is provided at four corners with four receiving holes 151 for engaging with the hooks 142 of the pair of holding-down clamps 14.

Two heat-transfer tubes 122 are separately extended through the two spaced holes 121a on the radiating fins 121 of the pair of first radiators 12, so that the radiating fins 131 of the second radiator 13 are located on the two heat-transfer tubes 122 with the two lower receiving recesses 131b separately bearing against the heat-transfer tubes 122. Meanwhile, a heat-transfer block 132 is fixedly connected to a lower side of the two heat-transfer tubes 122 to correspondingly locate below the second radiator 13. The seat 15 is firmly fixed to a top of the main board 16, and the first radiators 12 and the second radiator 13 are seated on the seat 15 with a lower side of the heat-transfer block 132 bearing against the CPU 161 on the main board 16. The pressure-bearing unit 11 is positioned in the receiving recesses 121b of the first radiators 12 and the upper receiving recess 131a of the second radiator 13. The holding-down clamps 14 is connected to the seat 15 by engaging the hooks 142 with the receiving holes 151, so that the press heads 141 are compressed against a top of the pressure-bearing unit 11. That is, a pressure applied by the holding-down clamps 14 is born by the pressure-bearing unit 11 to protect the radiating fins 121, 131 against deformation and avoid poor contact of the heat-transfer tubes 122 with the holes 121a that would happen when the pressure is otherwise directly applied to the radiating fins 121, 131 by the holding-down clamps 14. The pressure-bearing unit 11 also protects the heat-transfer tubes 122 from bending and accordingly reduced working efficiency due to the pressure applied by the holding-down clamps 14 on the radiators 12, 13, so that the radiators 12, 13 always provide an overall effective radiating effect.

Figure 3:
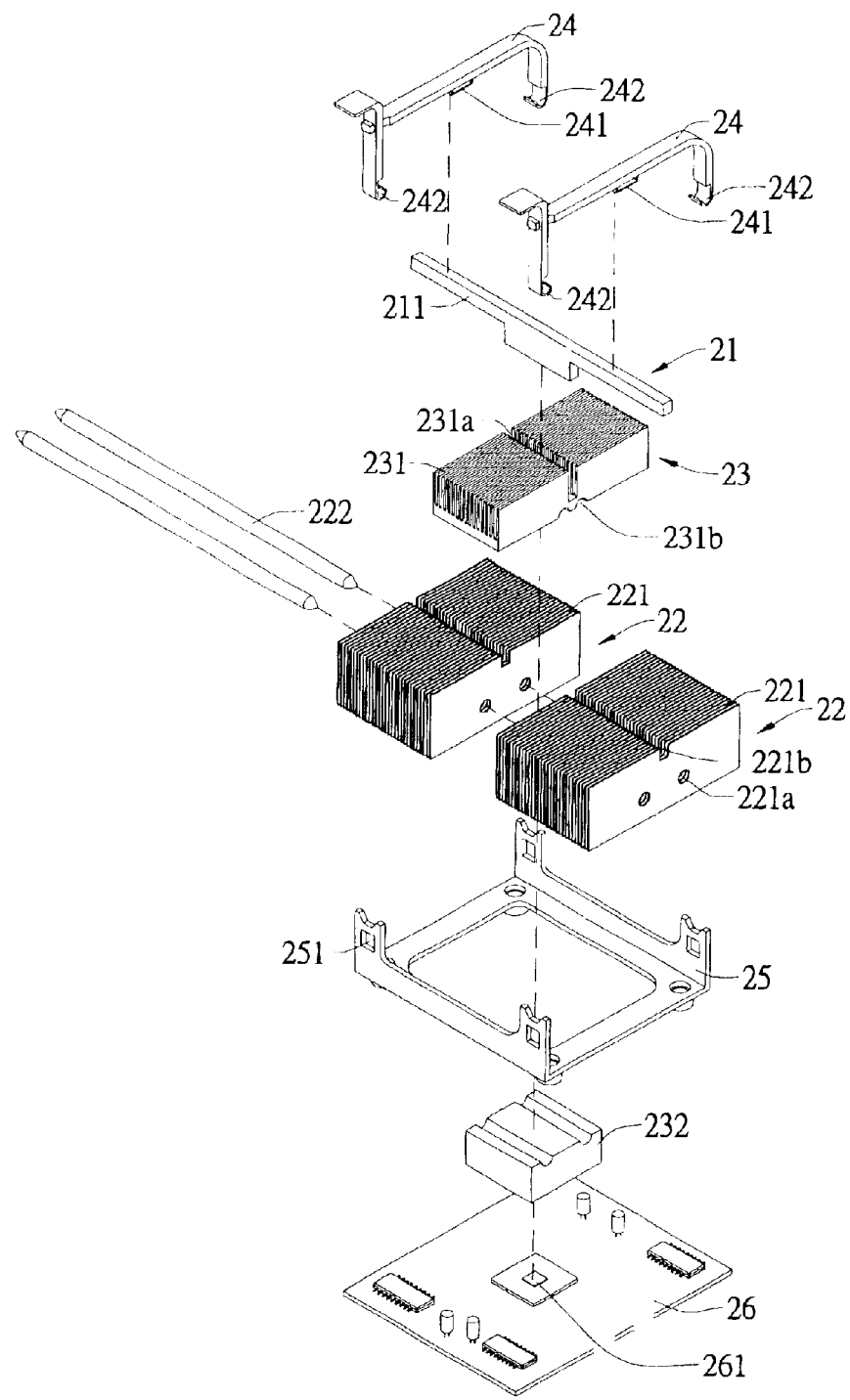
FIG. 3 is an exploded perspective view of a CPU radiator holding mechanism according to a second embodiment of the present invention.
Figure 4:
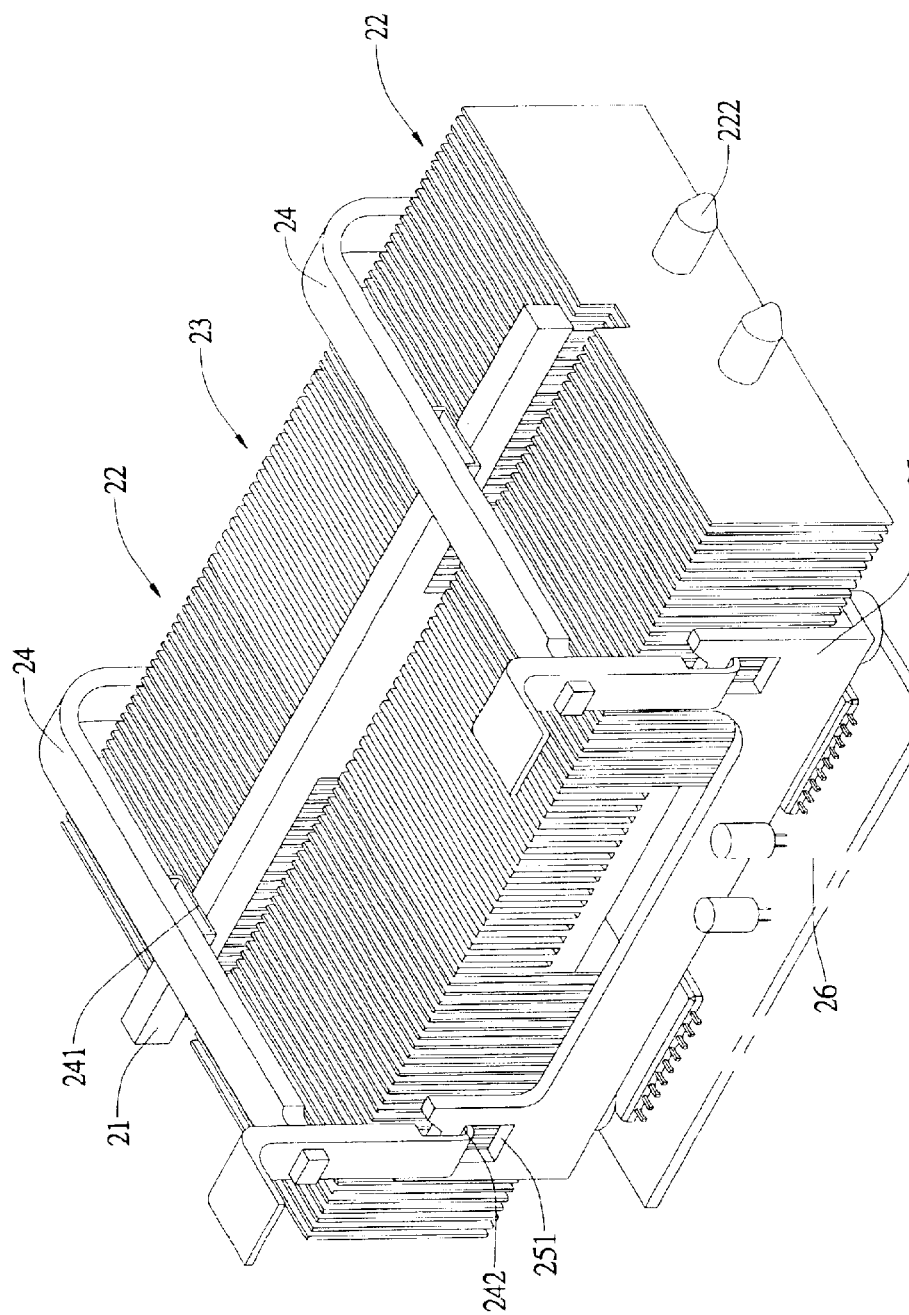
FIG. 4 is an assembled perspective view of FIG. 3.

FIGS. 3 and 4 are exploded and assembled perspective views, respectively, of a second embodiment of the present invention. As shown, the second embodiment includes a pressure-bearing unit 21, a pair of holding-down clamps 24, and a seat 25 for holding a pair of first radiators 22 and a second radiator 23 onto a main board 26 on which a CPU 261 is mounted.

The pressure-bearing unit 21 includes a generally strip-shaped member having two arms 211 sideward extended from two upper outer ends of a central portion thereof. The pressure-bearing unit 21 is made of a thermally conductive metal material, which may be selected from the group consisting of copper, aluminum, copper alloys, aluminum alloys, titanium alloys, and stainless steel, so that it also serves as an auxiliary radiating means of the first and second radiators 22, 23. Each of the first radiators 22 is formed from a plurality of vertically parallelly arranged radiating fins 221, and includes two horizontally spaced holes 221 a longitudinally extended through the radiating fins 121, and a receiving recess 221b longitudinally extended through an upper side of the first radiator 22 to locate above and between the two holes 221a. The second radiator 23 is formed from a plurality of vertically parallelly arranged radiating fins 231, and includes an upper receiving recess 231a and two spaced lower receiving recesses 231b corresponding to the receiving recesses 221b and the two through holes 221a, respectively, on the first radiators 22. Each of the two holding-down clamps 24 includes a press head 241 downward protruded from a lower center thereof and two downward extended legs, each of which has a hook 242 formed at a free end thereof. The seat 25 is provided at four corners with four receiving holes 251 for engaging with the hooks 242 of the pair of holding-down clamps 24.

Two heat-transfer tubes 222 are separately extended through the two spaced holes 221a on the radiating fins 221 of the pair of first radiators 22, so that the radiating fins 231 of the second radiator 23 are located on the two heat-transfer tubes 222 with the two lower receiving recesses 231b separately bearing against the heat-transfer tubes 222. Meanwhile, a heat-transfer block 232 is fixedly connected to a lower side of the two heat-transfer tubes 222 to correspondingly locate below the second radiator 23. The seat 25 is firmly fixed to a top of the main board 26, and the first radiators 22 and the second radiator 23 are seated on the seat 25 with a lower side of the heat-transfer block 232 bearing against the CPU 261 on the main board 26.

The pressure-bearing unit 21 is so positioned that the central portion thereof is located in the upper receiving recess 231a of the second radiator 23 and the two arms 211 are located overhead the receiving recesses 221b of the first radiators 22. This design allows even better flowing of air among the radiating fins 221 and 231. The holding-down clamps 24 is connected to the seat 25 by engaging the hooks 242 with the receiving holes 251, so that the press heads 241 are compressed against a top of the pressure-bearing unit 21. That is, a pressure applied by the holding-down clamps 24 is born by the pressure-bearing unit 21 to protect the radiating fins 221, 231 against deformation and avoid poor contact of the heat-transfer tubes 222 with the holes 221a that would happen when the pressure is otherwise directly applied to the radiating fins 221, 231 by the holding-down clamps 24. The pressure-bearing unit 21 also protects the heat-transfer tubes 222 from bending and accordingly reduced working efficiency due to the pressure applied by the holding-down clamps 24 on the radiators 22, 23, so that the radiators 22, 23 always provide an overall effective radiating effect.

Figure 5:
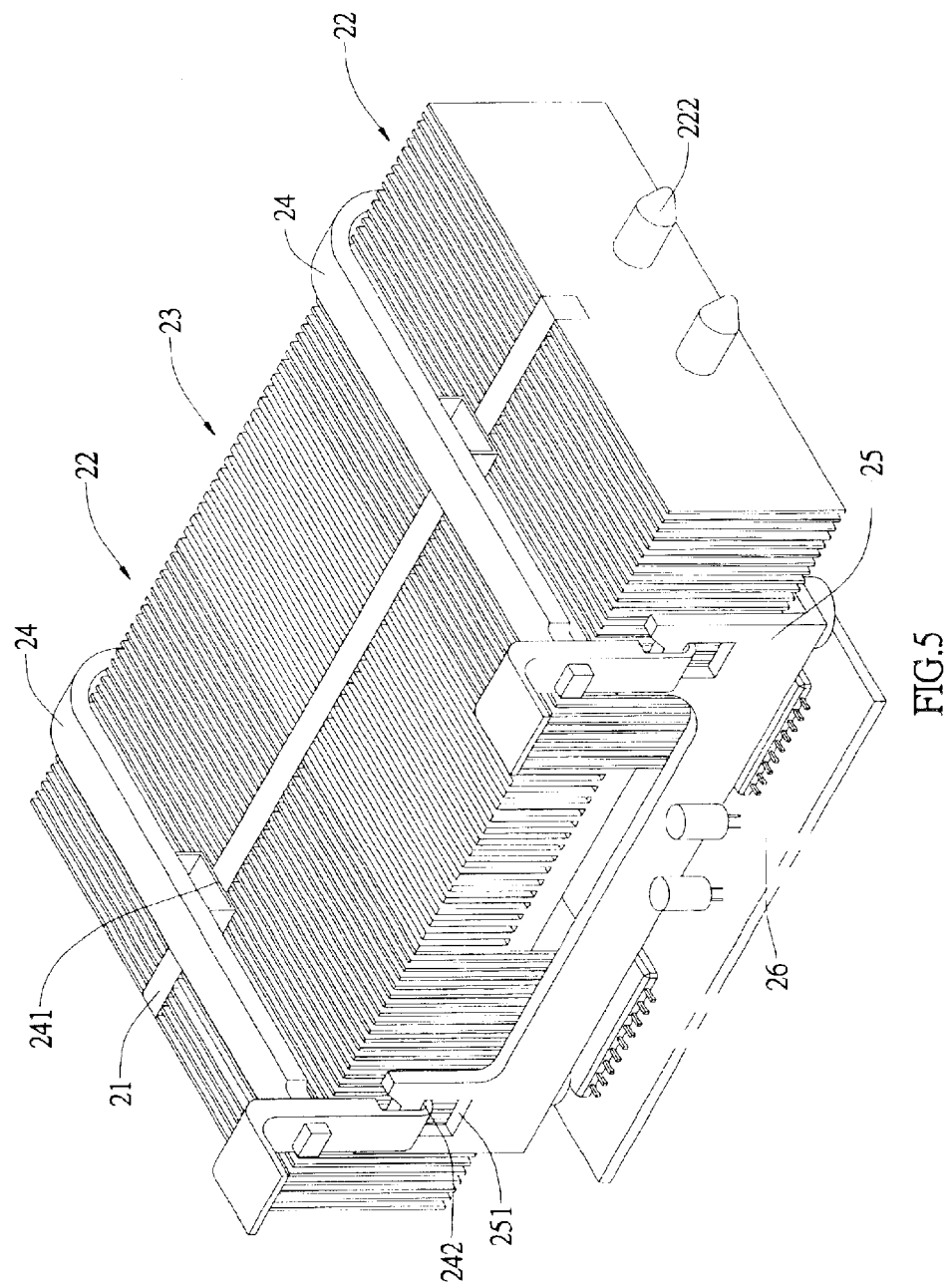
FIG. 5 is an assembled perspective view of a variant of the second embodiment of the present invention.

Please refer to FIG. 5 that shows a variant of the second embodiment of the present invention. In this variant, the two arms 211 of the pressure-bearing unit 21 have a reduced depth, such that the pressure-bearing unit 21 is positioned in the receiving recesses 221b and the upper receiving recess 231a with an upper surface flushing with the top of the first radiators 22 and the second radiator 23. This design allows a space above the first radiators 22 and the second radiator 23 to be otherwise effectively utilized.

Figure 6:
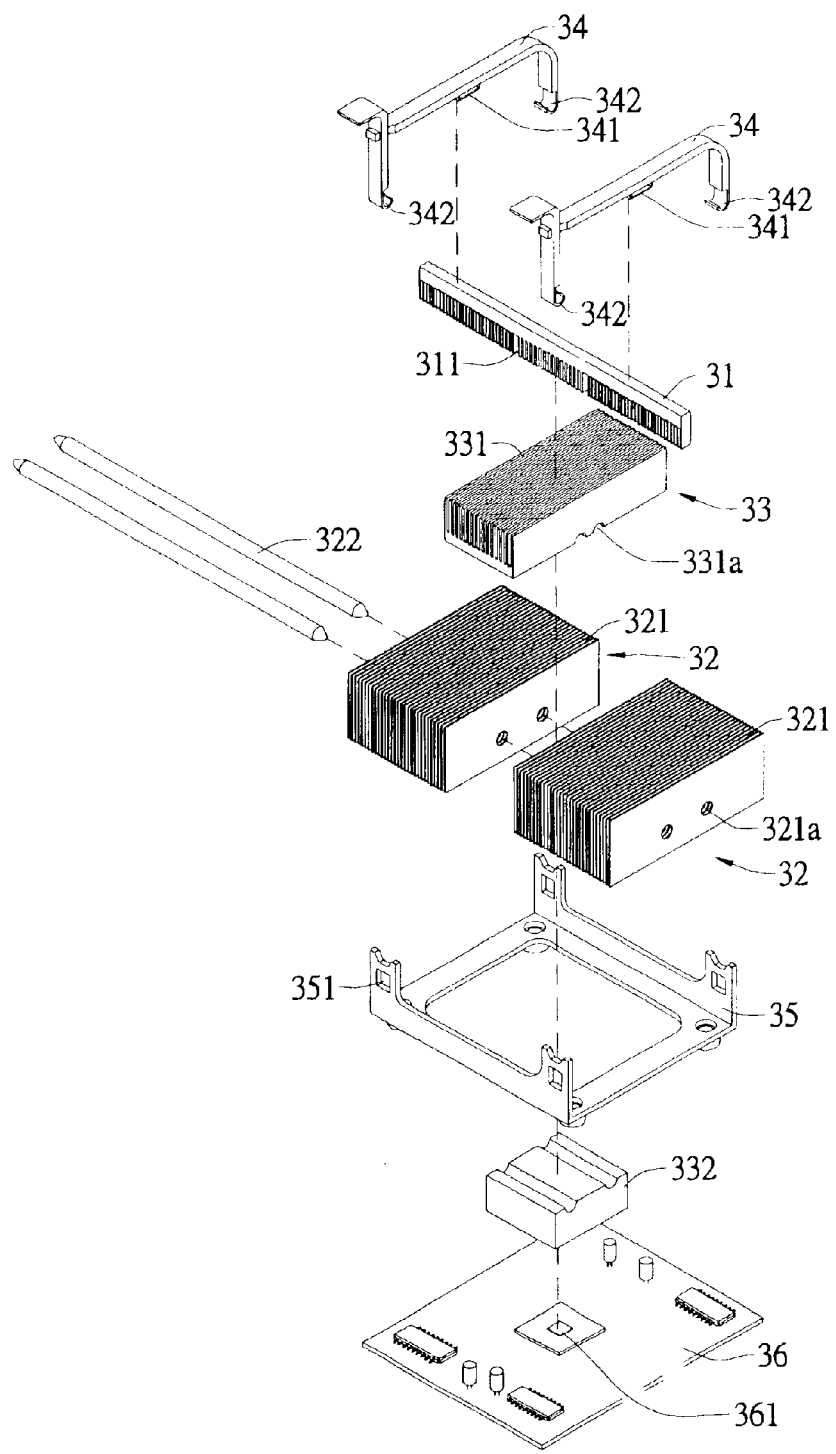
FIG. 6 is an exploded perspective view of a CPU radiator holding mechanism according to a third embodiment of the present invention.
Figure 7:
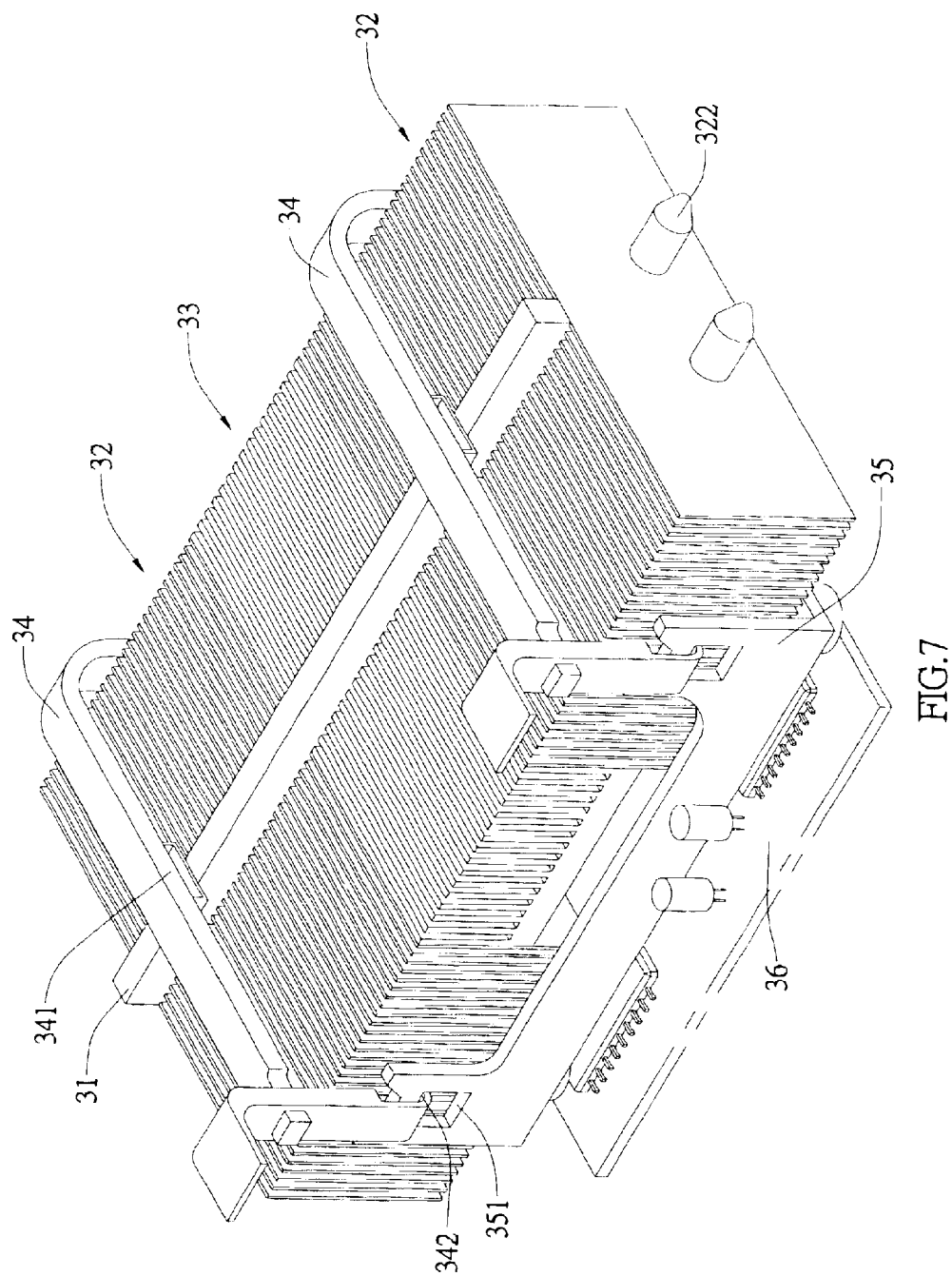
FIG. 7 is an assembled perspective view of FIG. 6.

FIGS. 6 and 7 are exploded and assembled perspective views, respectively, of a third embodiment of the present invention. As shown, the third embodiment includes a pressure-bearing unit 31, a pair of holding-down clamps 34, and a seat 35 for holding a pair of first radiators 32 and a second radiator 33 onto a main board 36 on which a CPU 361 is mounted.

The pressure-bearing unit 31 includes a generally strip-shaped member having a plurality of vertically parallelly arranged radiating fins 311 downward extended from a lower side thereof. The pressure-bearing unit 31 is made of a thermally conductive metal material, which may be selected from the group consisting of copper, aluminum, copper alloys, aluminum alloys, titanium alloys, and stainless steel, so that it also serves as an auxiliary radiating means of the first and second radiators 32, 33. Each of the first radiators 32 is formed from a plurality of vertically parallelly arranged radiating fins 321, and includes two horizontally spaced holes 321a longitudinally extended through the radiating fins 321. The second radiator 33 is formed from a plurality of vertically parallelly arranged radiating fins 331, and includes two spaced lower receiving recesses 331a corresponding to the two-through holes 321a on the first radiators 32. Each of the two holding-down clamps 34 includes a press head 341 downward protruded from a lower center thereof and two downward extended legs, each of which has a hook 342 formed at a free end thereof. The seat 35 is provided at four corners with four receiving holes 351 for engaging with the hooks 342 of the pair of holding-down clamps 34.

Two heat-transfer tubes 322 are separately extended through the two spaced holes 321a on the radiating fins 321 of the pair of first radiators 32, so that the radiating fins 331 of the second radiator 33 are located on the two heat-transfer tubes 322 with the two lower receiving recesses 331a separately bearing against the heat-transfer tubes 322. Meanwhile, a heat-transfer block 332 is fixedly connected to a lower side of the two heat-transfer tubes 322 to correspondingly locate below the second radiator 33. The seat 35 is firmly fixed to a top of the main board 36, and the first radiators 32 and the second radiator 33 are seated on the seat 3 with a lower side of the heat-transfer block 332 bearing against the CPU 361 on the main board 36. The pressure-bearing unit 31 is so positioned that it is protruded from the top of the radiators 32, 33 with the radiating fins 311 downward extended into the radiators 32, 33 to alternate with the radiating fins 321 and 331. The holding-down clamps 34 is connected to the seat 35 by engaging the hooks 342 with the receiving holes 351, so that the press heads 341 are compressed against a top of the pressure-bearing unit 31. That is, a pressure applied by the holding-down clamps 34 is born by the pressure-bearing unit 31 to protect the radiating fins 321, 331 against deformation and avoid poor contact of the heat-transfer tubes 322 with the holes 321a that would happen when the pressure is otherwise directly applied to the radiating fins 321, 331 by the holding-down clamps 34. The pressure-bearing unit 31 also protects the heat-transfer tubes 322 from bending and accordingly reduced working efficiency due to the pressure applied by the holding-down clamps 3 on the radiators 32, 33, so that the radiators 32, 33 always provide an overall effective radiating effect.

Figure 8:
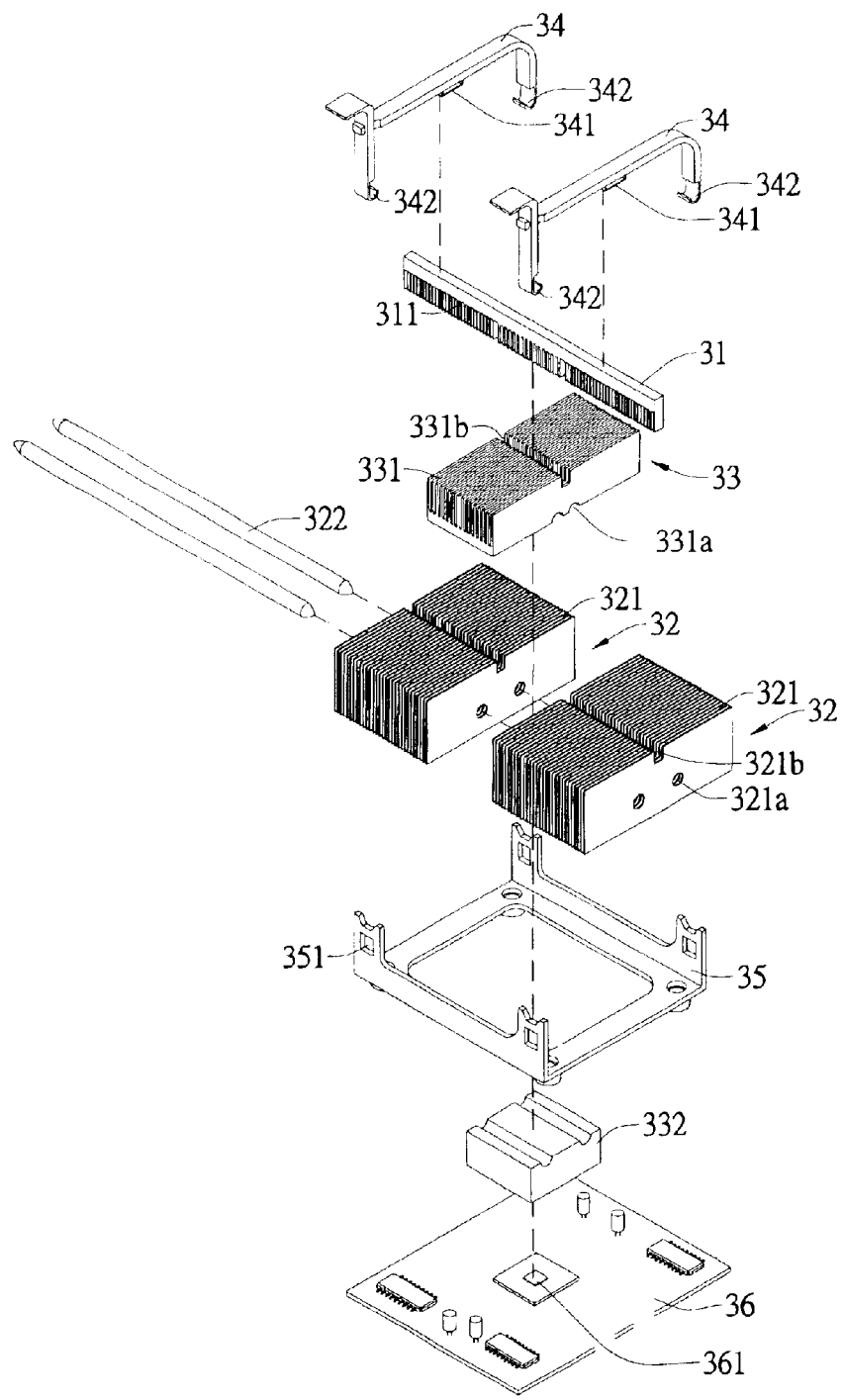
FIG. 8 is an exploded perspective view of a variant of the third embodiment of the present invention.
Figure 9:
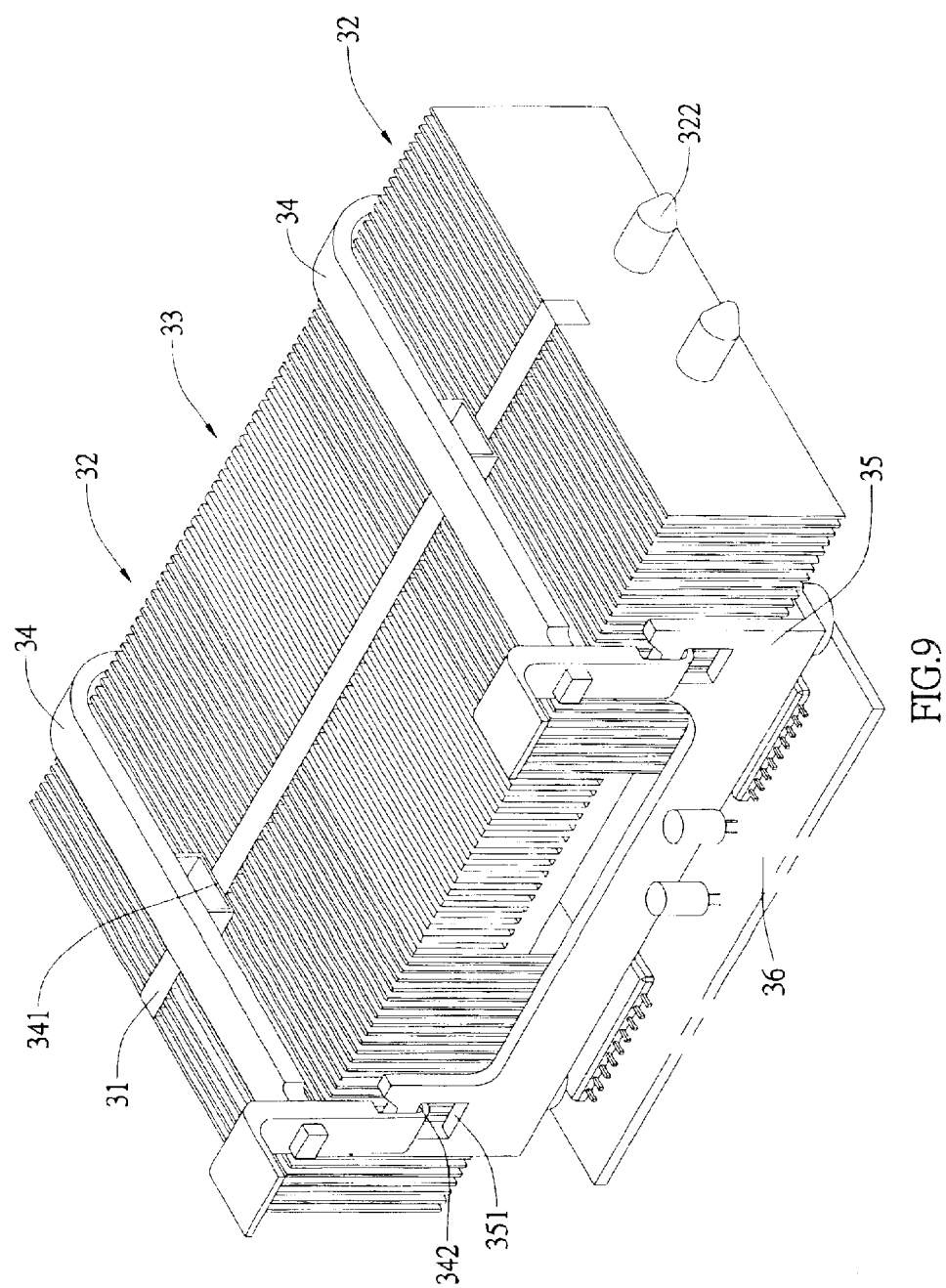
FIG. 9 is an assembled perspective view of FIG. 8.

Please refer to FIGS. 8 and 9 that shows a variant of the third embodiment of the present invention. In this variant, each of the pair of first radiators 32 is provided at a top with a receiving recess 321b, and the second radiator 33 is provided at a top with an upper receiving recess 331b, and the pressure-bearing unit 31 is positioned in the receiving recesses 321b and the upper receiving recess 331b to flush with the top of the radiators 32, 33. This design allows a space above the first radiators 32 and the second radiator 33 to be otherwise effectively utilized.

The present invention has been described with some preferred embodiments thereof and it is understood that many changes and modifications in the described embodiments can be carried out without departing from the scope and the spirit of the invention as defined by the appended claims.

What is claimed is:

1. A CPU radiator holding mechanism, comprising:
   a pressure-bearing unit, said pressure-bearing unit is made of a thermally conductive material;
   a radiator formed from a plurality of radiating fins and provided at a top thereof with a receiving recess for receiving said pressure-bearing unit therein;
   a pair of holding-down clamps, each of which being provided at predetermined positions with hooks;
   a seat provided at predetermined positions with receiving holes for engaging with said hooks on said holding-down clamps;
   said radiator being fixedly connected to said seat by pressing said holding-down clamps against said pressure-bearing unit positioned in said receiving recess of said radiator, and engaging said hooks of said holding-down clamps with said receiving holes of said seat, such that any pressure applied by said holding-down clamps onto said pressure-bearing unit does not cause any deformation of said radiating fins of said radiator; and
   said thermally conductive material is selected from the group consisting of copper, aluminum, copper alloys, aluminum alloys, titanium alloys, and stainless steel.

2. A CPU radiator holding mechanism, comprising:
   a pressure-bearing unit having two arms sideward extended from two upper outer ends of a central portion thereof, said pressure-bearing unit is made of a thermally conductive material;
   a radiator formed from a plurality of radiating fins and provided at a top thereof with a receiving recess for receiving said central portion of said pressure-bearing unit therein;
   a pair of holding-down clamps, each of which being provided at predetermined positions with hooks;
   a seat provided at predetermined positions with receiving holes for engaging with said hooks on said holding-down clamps;
   said radiator being fixedly connected to said seat by pressing said holding-down clamps against said pressure-bearing unit positioned in said receiving recess of said radiator, and engaging said hooks of said holding-down clamps with said receiving holes of said seat, such that any pressure applied by said holding-down clamps onto said pressure-bearing unit does not cause any deformation of said radiating fins of said radiator; and
   said thermally conductive material is selected from the group consisting of copper, aluminum, copper alloys, aluminum alloys, titanium alloys, and stainless steel.

3. A CPU radiator holding mechanism, comprising:
   a pressure-bearing unit having two arms sideward extended from two upper outer ends of a central portion thereof;
   a radiator formed from a plurality of radiating fins and provided at a top thereof with a receiving recess for receiving said central portion of said pressure-bearing unit therein;
   a pair of holding-down clamps, each of which being provided at predetermined positions with hooks;
   a seat provided at predetermined positions with receiving holes for engaging with said hooks on said holding-down clamps;
   said radiator being fixedly connected to said seat by pressing said holding-down clamps against said pressure-bearing unit positioned in said receiving recess of said radiator, and engaging said hooks of said holding-down clamps with said receiving holes of said seat, such that any pressure applied by said holding-down clamps onto said pressure-bearing unit does not cause any deformation of said radiating fins of said radiator; and
   said arms of said pressure-bearing unit have a reduced depth, such that said pressure-bearing unit is positioned in said receiving recess of said radiator to flush with the top of said radiator.

4. A CPU radiator holding mechanism, comprising:
   a pressure-bearing unit having a plurality of radiating fins downward extended from a lower side thereof;
   a radiator formed from a plurality of radiating fins, and adapted to engage at a top with said pressure-bearing unit with said radiating fins of said radiator and said radiating fins of said pressure-bearing unit alternating with one another, and said radiator including a receiving recess;
   a pair of holding-down clamps, each of which being provided at predetermined positions with hooks;
   a seat provided at predetermined positions with receiving holes for engaging with said hooks on said holding-down clamps; and
   said radiator being fixedly connected to said seat by pressing said holding-down clamps against said pressure-bearing unit positioned in said receiving recess of said radiator, and engaging said hooks of said holding-down clamps with said receiving holes of said seat, such that any pressure applied by said holding-down clamps onto said pressure-bearing unit does not cause any deformation of said radiating fins of said radiator.

5. The CPU radiator holding mechanism as claimed in claim 4, wherein said pressure-bearing unit is made of a thermally conductive material.

6. The CPU radiator holding mechanism as claimed in claim 5, wherein said thermally conductive material is selected from the group consisting of copper, aluminum, copper alloys, aluminum alloys, titanium alloys, and stainless steel.

7. The CPU radiator holding mechanism as claimed in claim 4, wherein said radiator is provided at the top with a receiving recess, such that said pressure-bearing unit is positioned in said receiving recess of said radiator to flush with the top of said radiator.

* * * * *